(12) United States Patent
Kertesz et al.

(10) Patent No.: US 7,482,678 B2
(45) Date of Patent: Jan. 27, 2009

(54) SURFACE-MOUNTED MICROWAVE PACKAGE AND CORRESPONDING MOUNTING WITH A MULTILAYER CIRCUIT

(75) Inventors: Philippe Kertesz, Rueil Malmaison (FR); Bernard Ledain, Sevres (FR); Daniel Caban-Chastas, Issy les Moulineaux (FR)

(73) Assignee: Thales, Neuilly sur Seine (FR)

( * ) Notice: Subject to any disclaimer, the term of this patent is extended or adjusted under 35 U.S.C. 154(b) by 203 days.

(21) Appl. No.: 10/539,735

(22) PCT Filed: Dec. 8, 2003

(86) PCT No.: PCT/EP03/50964

§ 371 (c)(1), (2), (4) Date: Jun. 20, 2005

(87) PCT Pub. No.: WO2004/057670

PCT Pub. Date: Jul. 8, 2004

(65) Prior Publication Data

US 2006/0071311 A1    Apr. 6, 2006

(30) Foreign Application Priority Data

Dec. 20, 2002    (FR) ................... 02 16363

(51) Int. Cl.
*H01L 23/552*    (2006.01)
*H01L 23/48*    (2006.01)
(52) U.S. Cl. .................. 257/659; 257/660; 257/738

(58) Field of Classification Search ............... 257/659, 257/660, 737, 738, 778–780, E23.114, 748
See application file for complete search history.

(56) References Cited

U.S. PATENT DOCUMENTS

| 4,551,746 A | * | 11/1985 | Gilbert et al. ............... 257/691 |
| 5,796,170 A | | 8/1998 | Marcantonio |
| 5,821,604 A | | 10/1998 | Egawa |
| 5,986,340 A | | 11/1999 | Smith et al. |
| 6,282,095 B1 | | 8/2001 | Brench et al. |
| 2002/0020916 A1 | | 2/2002 | Ito |

* cited by examiner

*Primary Examiner*—Hung Vu
(74) *Attorney, Agent, or Firm*—Lowe Hauptman Ham & Berner, LLP

(57) ABSTRACT

The invention relates to a microwave package delimiting an interior volume, comprising a Faraday cage formed by a conducting surface surrounding the interior volume, a connection point placed outside the Faraday cage, the connection point being intended to be linked electrically to an exterior circuit, an input-output passing through the Faraday cage and linked electrically to the connection point, a base forming a face of the package, the exterior surface of the base forming a mounting surface intended to be applied to the exterior circuit, the connection point being placed on the mounting surface, so that the connection point is placed between the Faraday cage and the exterior circuit when the package is mounted on the exterior circuit. The invention applies to microwave packages used in the realms of avionics, telecommunications, space.

19 Claims, 6 Drawing Sheets

SURFACE-MOUNTED MICROWAVE PACKAGE AND CORRESPONDING MOUNTING WITH A MULTILAYER CIRCUIT

CROSS-REFERENCE TO RELATED APPLICATIONS

The present Application is based on International Application No. PCT/EP03/50964, filed on Dec. 8, 2003, which in turn corresponds to FR 02/16363 filed on Dec. 20, 2002, and priority is hereby claimed under 35 USC §119 based on these applications. Each of these applications are hereby incorporated by reference in their entirety into the present application.

TECHNICAL FIELD

The present invention relates to a microwave package with surface mounting and to such a package mounted on a multilayer circuit. It applies in particular to the microwave packages used in the realms of avionics, telecommunications, space.

Microwave components are generally placed in packages, called microwave packages, a function of which is to protect the components from the exterior electromagnetic environment and to avoid the propagation of parasitic modes inside. To this end, the interior volume of the microwave packages is surrounded by a conducting surface forming an earth, the dimensions of a package being less than half a wavelength (of the order of 70 mm for a frequency of 20 GHz). Microwave packages have another function, namely of protecting the components from the exterior physical environment, in particular from humidity. For this purpose, the packages are sealed hermetically, a neutral gas being enclosed within the package.

PRIOR ART

In order to carry out microwave functions, it is necessary to interconnect various microwave components, to supply them and to control them through low frequency signals, the various components being placed in different packages.

It is known to use microwave packages known as "planar packs" in the literature. A "planar pack" package comprises a ceramic element and an etched metal sheet, the so-called "lead frame" as it is called in the literature. The ceramic element generally has a U-shaped base, and is sealed by a cover soldered to this base to ensure hermetic closure. A microwave component (bare chip for example) can be placed in the ceramic element. A surface of the ceramic element is gold plated to form an earth. The U base is carried by the etched metal sheet. This metal sheet comprises microstrip lines for conveying the microwave signals to the microwave component, and lines for conveying the low frequency signals (power supply, control).

However, the microwave lines radiate in the half-space delimited by the metal sheet ("lead frame") on the side of the ceramic element. This brings about parasitic electromagnetic couplings between the microwave input and output of one and the same package on the one hand and between neighbouring packages on the other hand.

In order to avoid these parasitic couplings, it is known to add metal walls around the microstrip lines. However, this solution is very expensive on account of the use of bare chips that have to be tested beforehand. Moreover, the metal walls occupy a significant volume, and their installation requires manual operations. Moreover, this solution is difficult to implement for high frequency ranges, since the frequencies increasing, the characteristic dimensions decrease.

DESCRIPTION OF THE INVENTION

The invention is intended to resolve these drawbacks. An aim of the invention is to make input-outputs (microwave and low frequency) in microwave packages, while avoiding any parasitic electromagnetic coupling, and to do so in a simple manner.

To this end, a subject of the invention is in particular a microwave package delimiting an interior volume, comprising at least:
  a Faraday cage formed by a conducting surface surrounding the interior volume,
  a connection point placed outside the Faraday cage, the connection point being intended to be linked electrically to an exterior circuit,
  an input-output passing through the Faraday cage and linked electrically to the connection point,
  a base forming a face of the package, the exterior surface of the base forming a mounting surface intended to be applied to the exterior circuit, the connection point being placed on the mounting surface, so that the connection point is placed between the Faraday cage and the exterior circuit when the package is mounted on the exterior circuit.

Thus, the input-output is confined between a face of the package on one side, and the circuit on the other side. The radiations in the half-space are stopped by the package itself.

A subject of the invention is also a mounting comprising a package of this type and a multilayer circuit, the package being mounted on the multilayer circuit, the multilayer circuit comprising at least one conducting earth plane, a metallized hole is made in the multilayer circuit opposite the connection point of the package, so as to convey the signal across the earth plane to a track of the circuit.

Thus the surface lines are dispensed with and replaced by tracks of the multilayer circuit.

According to an advantageous embodiment, the tracks of the multilayer circuit are placed between two earth planes. In this way, the layout of the card being designed so that the signal remains in stripline mode (by way of a metallized hole), the quality of its shielding is maintained.

According to an advantageous embodiment, the connection point is linked to the input-output by a straight link, the link being perpendicular to the exterior circuit when the package is mounted on top.

According to an advantageous embodiment, the connection point is formed by a conducting signal ball, the package furthermore comprises a coaxial structure shielding the connection point, the coaxial structure being formed by conducting earth balls, linked electrically to the Faraday cage, and placed around the signal ball.

According to an advantageous embodiment, a component is placed in the interior volume of the package, the component being carried by a radiator forming a face of the package, the radiator being opposite the face carrying the mounting surface.

The main advantages of the invention are that it makes it possible, as compared with direct wiring on a circuit, to easily dismount the package (since the latter is surface mounted) so as to carry out tests for example. Moreover, the transitions being vertical (perpendicular to the plane of the circuit), the package according to the invention may be used in wideband applications.

According to an advantageous embodiment, the contact points are formed by conducting balls. This makes it possible to carry out the soldering simply and reliably, the distance between the circuit and the package being related to the diameter of the balls. Moreover, the dismounting of the package may be done by sending a jet of hot air under the package, this not being possible if the package were glued for example.

BRIEF EXPLANATION OF THE FIGURES

Other characteristics and advantages of the invention will become apparent on reading the following detailed description presented by way of nonlimiting illustration and making reference to the appended figures, in which.

APPROACHES TO IMPLEMENTATION OF THE INVENTION

Figure 1:
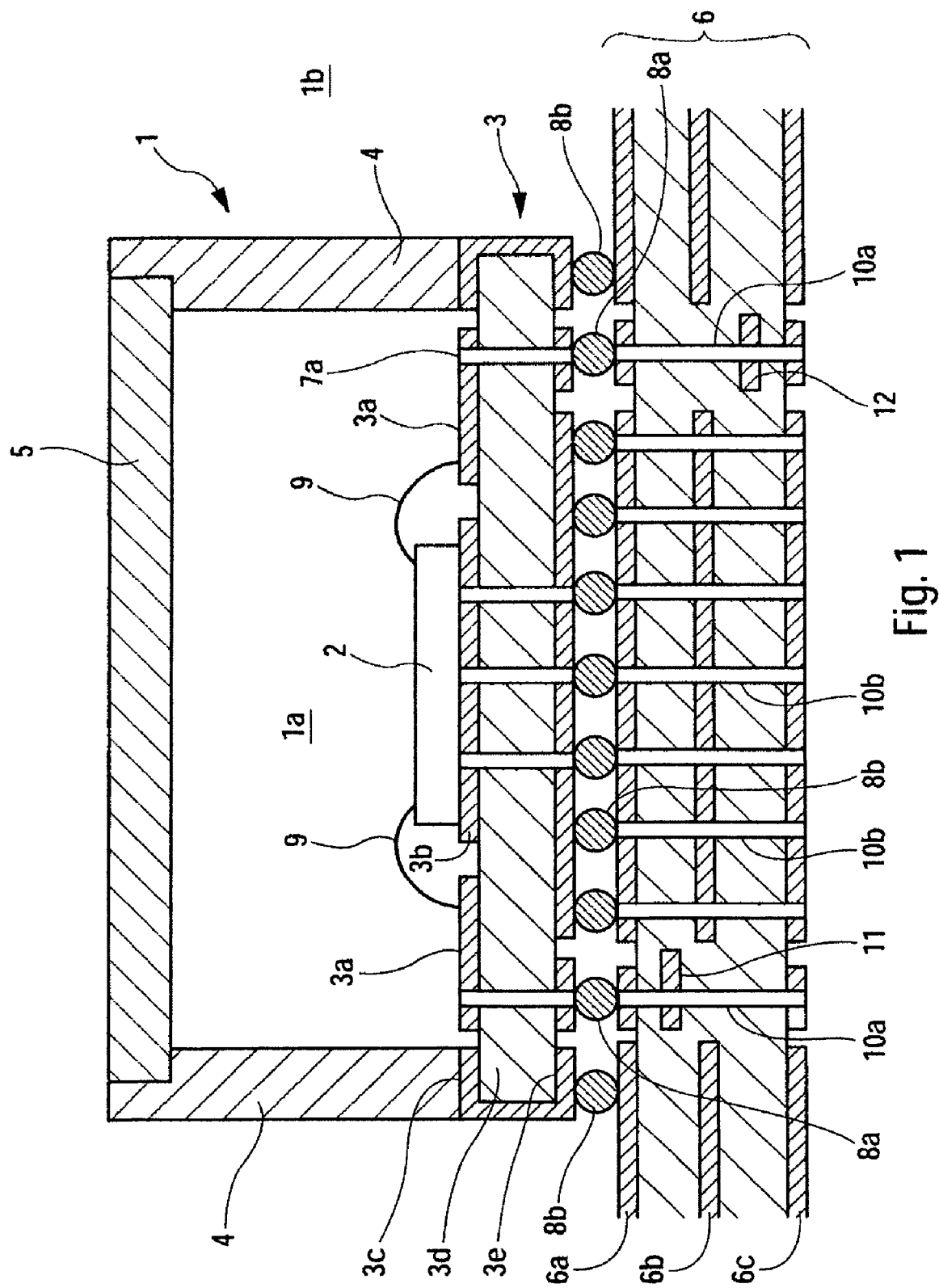
FIGS. 1 to 3, an exemplary implementation of the invention with a package in a "face up" configuration.
Figure 2:
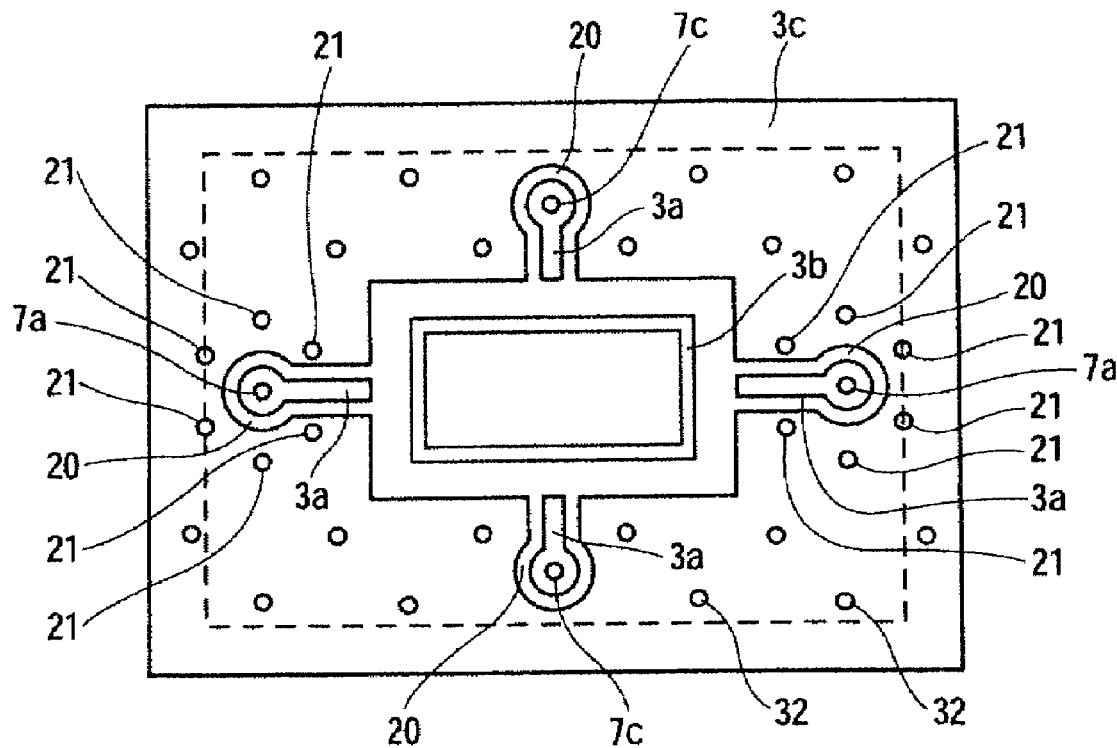
Figure 3:
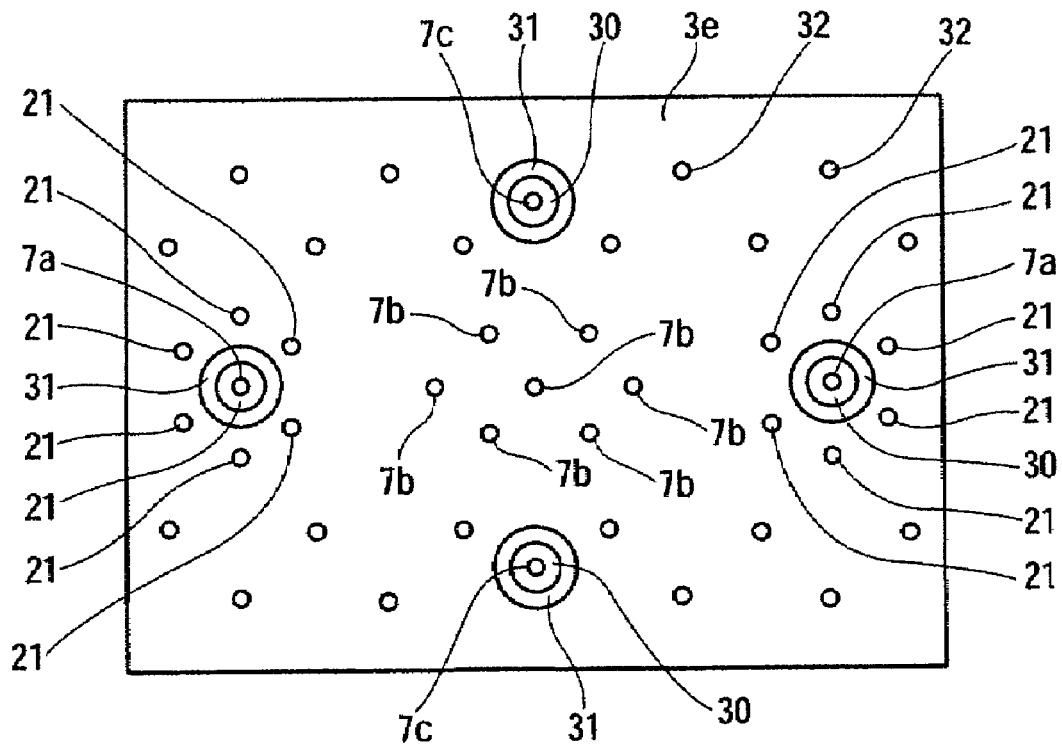
Figure 4:
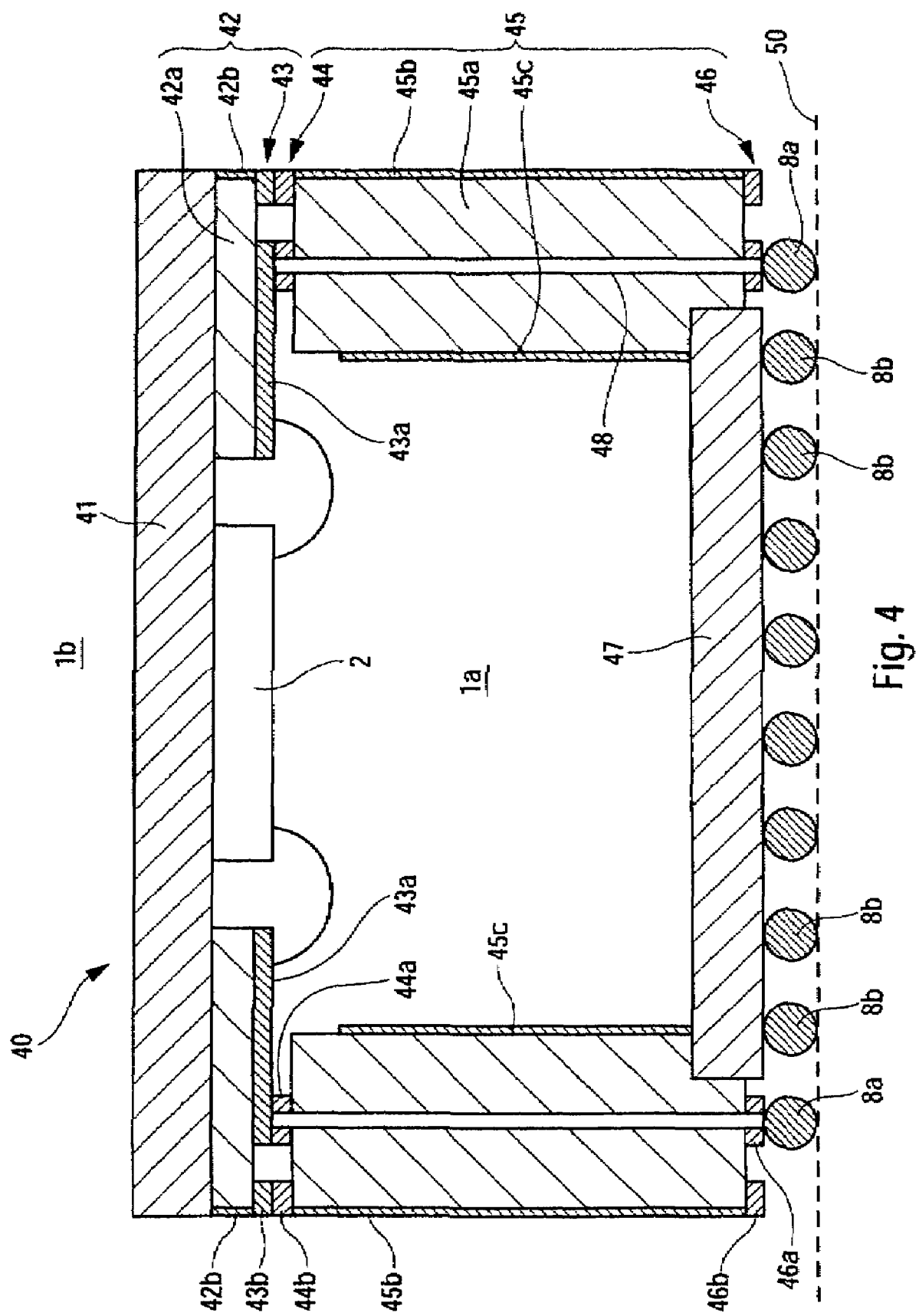
FIGS. 4 to 7, another exemplary implementation of the invention with a package in a "face down" configuration.

Reference is now made to FIGS. 1 to 3 in which is represented an exemple of an implementation of the invention, with a package of "face up" type, that is to say whose microwave component or components are placed on the package wall intended to be mounted on the exterior circuit.

The package 1 makes it possible to delimit an interior volume 1a. A base 3 forms a wall of the package. The base is intended to be mounted on the exterior circuit 6. The base 3 may be a printed circuit comprising two conducting layers. Of course, the printed circuit forming the base may comprise a different number of conducting layers. The circuit forming the base 3 may be made using an insulating material, preferably organic. This insulating material may be metallized with copper for example to form the two conducting layers. Stated otherwise, the circuit comprises a thickness of insulating material 3d, on which are deposited conducting layers on either side of the insulating thickness.

The first conducting layer forms an interior face of the package 1. This layer comprises conducting surfaces 3a, 3b, 3c etched by methods known to the person skilled in the art.

The second conducting layer can form an exterior face of the package (in this example). It essentially comprises a single conducting surface 3e. This conducting surface 3e almost entirely covers the whole surface of the base 3, forming an earth. This earth is intended to be linked electrically to the exterior circuit 6.

The package furthermore comprises a conducting structure 4, 5 which together with the surface 3e forms a Faraday cage surrounding the interior volume 1a of the package. The interior volume 1a is thus protected against exterior electromagnetic disturbances. The conducting structure may be formed by a metallized cap. According to a variant embodiment, the conducting structure may, (as represented in FIG. 1) be formed by metal walls 4 covered with a metal plate 5. The metal plate 5, the walls 4 and the base 3 may be soldered.

A microwave component 2 is mounted in the package 1. The earth of the component is in contact with a conducting surface 3b of the interior layer of the base 3. The microwave component may be a bare chip for example. This chip may be soldered or glued with a conducting glue, preferably soldered, onto the conducting surface 3b. The conducting surface 3b is linked electrically to the exterior layer 3e (see FIG. 3) by one or more, preferably more, metallized holes 7b. A microwave earth is thus produced.

Advantageously, the metallized holes 7b are plugged to ensure the leaktightness of the package 1.

The microwave and low frequency inputs-outputs of the chip 2 are linked to tracks 3a of the interior layer of the base 3, for example with conducting wires 9. Each track 3a is linked electrically to a disk 30 (see FIG. 3) of the exterior layer of the base 3. This electrical link is effected by metallized signal holes 7a and 7c, passing through the base 3, respectively conveying the microwave signals and the low frequency signals. Advantageously, the metallized holes 7a and 7c are plugged to ensure the leaktightness of the package 1. The disks 30 are insulated electrically from the exterior conducting layer 3e. For this purpose, recesses 31 are made in the conducting layer 3e.

According to a first embodiment, the disks 30 form connection points of the package 1. These connection points are intended to be linked electrically directly to the exterior circuit 6. The links (not represented) between the exterior circuit 6 and the connection points may be made by soldering or gluing.

According to an advantageous embodiment (see FIG. 1), conducting balls 8a are placed in contact with the disks 30. These conducting balls 8a are an integral part of the package. They then form the connection points of the package in place of the disks 30. The conducting balls 8a may be tin-lead balls for example. They have the advantage of not deforming during the mounting of the package on the exterior circuit 6, thereby making it possible to control the distance between the package 1 and the circuit 6. The balls 8a may be soldered or glued, preferably soldered, onto the circuit 6.

The interior conducting layer may comprise a conducting surface 3c. The conducting surface 3c is linked electrically with the exterior conducting layer 3e by metallized holes, preferably plugged. Advantageously, these metallized holes are distributed according to a regular grid. According to an advantageous embodiment of the invention, the conducting tracks 3a intended to transmit microwave signals are placed in recesses 20 of the conducting surface 3c, so as to shield these tracks in the plane of these tracks (interior layer).

According to an advantageous embodiment, metallized earth holes 21 electrically link the interior conducting surface 3c with the exterior conducting layer 3e. Advantageously these holes are plugged to ensure the leaktightness of the package 1. They are distributed at the periphery of the metallized holes for microwave signals 7a. In this manner, a microwave shielding is produced in the thickness of the base 3, that is to say in the insulating thickness 3d. Advantageously, these metallized holes are at least three in number per metallized microwave signal hole 7a. They are preferably distributed over 360° so as to form a complete shielding.

According to an advantageous embodiment, conducting earth balls (not represented) are placed at the output of the metallized earth holes 21. These conducting balls are an integral part of the package 1. In this way, a coaxial structure is formed which shields the connections between the microwave input-output and the circuit 6. Stated otherwise, a shielding is produced at the level of the connection itself, that is to say in the space lying between the package and the circuit 6.

Other conducting balls 8b, constituting an integral part of the package 1, may be placed so as to electrically link the conducting surface 3e with the earth of the circuit 6. These conducting balls 8b do not necessarily lie along the extension of the metallized holes 32 formed in the base 3.

Advantageously, the diameter of the balls (earth balls and microwave signal balls), the diameter of the metallized holes, the distance between a signal ball and the earth balls the surrounding it, and the number of earth balls, are determined so as to obtain a controlled impedance, of 50 ohms for example.

The circuit 6 on which the package is intended to be mounted may be a multilayer circuit. The circuit 6 comprises at least one conducting earth plane 6a. A metallized hole 10a is made in the multilayer circuit opposite the connection point 8a of the package 1, so as to convey the signal across the conducting earth plane 6a. The signal arrives by way of the metallized hole 10a at a track 11 for example, the track and the earth plane forming a structure making it possible to propagate a microwave signal.

According to an advantageous embodiment, the circuit comprises a second conducting earth plane 6b placed under the track 11. Stated otherwise, the circuit 6 comprises two microwave earth layers 6a, 6b between which a microwave signal propagates. A shielded structure is thus formed.

According to an advantageous embodiment, a part of the signal being conveyed between the earth planes 61 and 6b, at least one connection is made with another layer of the circuit 6, placed under the earth plane 6b. Microwave signals may thus be propagated in different layers 11, 12 of the circuit 6.

Advantageously, a third earth plane 6c is placed under the layer 12. Of course, the multilayer circuit 6 may have a different configuration. It may comprise more earth planes and more layers propagating microwave or low frequency signals.

The earth balls of the package are preferably linked to the earth plane 6a. They may also be linked to the other earth planes through metallized holes.

According to an advantageous embodiment, the conducting earth planes of the circuit are linked together by metallized holes 10b. A microwave shielding is thus formed in the thickness of the circuit.

Reference is now made to FIGS. 4 to 7 in which is represented an exemple of implementation of the invention, with a package of "face down" type, that is to say one whose microwave component or components are placed on a wall of the package opposite the wall intended to be mounted on the exterior circuit. This configuration is used for microwave components that have to dissipate heat (amplifiers for example).

The package 40 makes it possible to delimit an interior volume 1a with respect to the exterior 1b. It essentially comprises a cap 41, 42 placed on a base 45, 47. The cap essentially comprises a radiator 41 formed by a rectangular plate, under which is placed an upper frame 42. The base essentially comprises a lower frame 45 under which is placed a rectangular plate 47. When the cap is on the base, the upper frame and the lower frame are superimposed. The exterior surface of the base forms a mounting surface, intended to be mounted on the exterior circuit (not represented).

The radiator 41 is an item that can dissipate heat, preferably made of a nonorganic electrically conducting material, such as metal, for example copper. A microwave component 2, such as a bare chip, is linked by its earth to the radiator. This link between the microwave component and the radiator may be effected by soldering.

The upper frame 42 (see FIGS. 4 and 5) is placed under the interior face of the radiator 41. The exterior periphery 42b of this frame, rendered conducting for example by metallized deposition, is flush with the periphery of the radiator 41. The frame 42 comprises an electrically insulating thickness 42a, for example of organic material. An electrically conducting layer 43 is deposited under the insulating thickness 42a. Consequently, the conducting layer 43 covers the frame surface opposite the radiator 41.

The lower frame 45 (see FIGS. 4 and 6) is placed under the upper frame 42. The exterior periphery 45d of this frame, rendered conducting for example by a metallized deposition, is flush with the periphery of the radiator 41 and of the upper frame 42. These exterior peripheries form the lateral exterior surfaces of the package 40. The frame 45 comprises an insulating thickness 45a, for example of organic material, on which are deposited on either side two conducting layers 44, 46, a first conducting layer 44 being in contact with the conducting layer 43 of the upper frame 42, the second conducting layer facing the exterior circuit 6 when the package 40 is mounted on top. The second conducting layer 46 comprises a surface 46b, forming an earth, almost entirely covering the frame surface on which it is applied (see FIG. 6). The conducting layer 46 constitutes part of the mounting surface.

The plate 47 has substantially the same surface area as the radiator 42. The plate 47 is placed in the lower part of the lower frame (see FIG. 4). The exterior surface of the plate 47 constitutes part of the mounting surface. At least one surface of the base 47 is conducting, the base being metal or metallized. This surface forms an earth intended to be linked electrically with the exterior circuit (not represented). Advantageously, this surface is the mounting surface.

A conducting surface, constituting an integral part of the package, surrounds the interior volume 1a, thus forming a Faraday cage. In this example, the conducting surface is formed by the radiator 41, the base 47 (metallized or metal), the exterior periphery 42b, 45b of the superimposed frames, and the surface 46b of the layer 46 facing the circuit.

Figure 5:
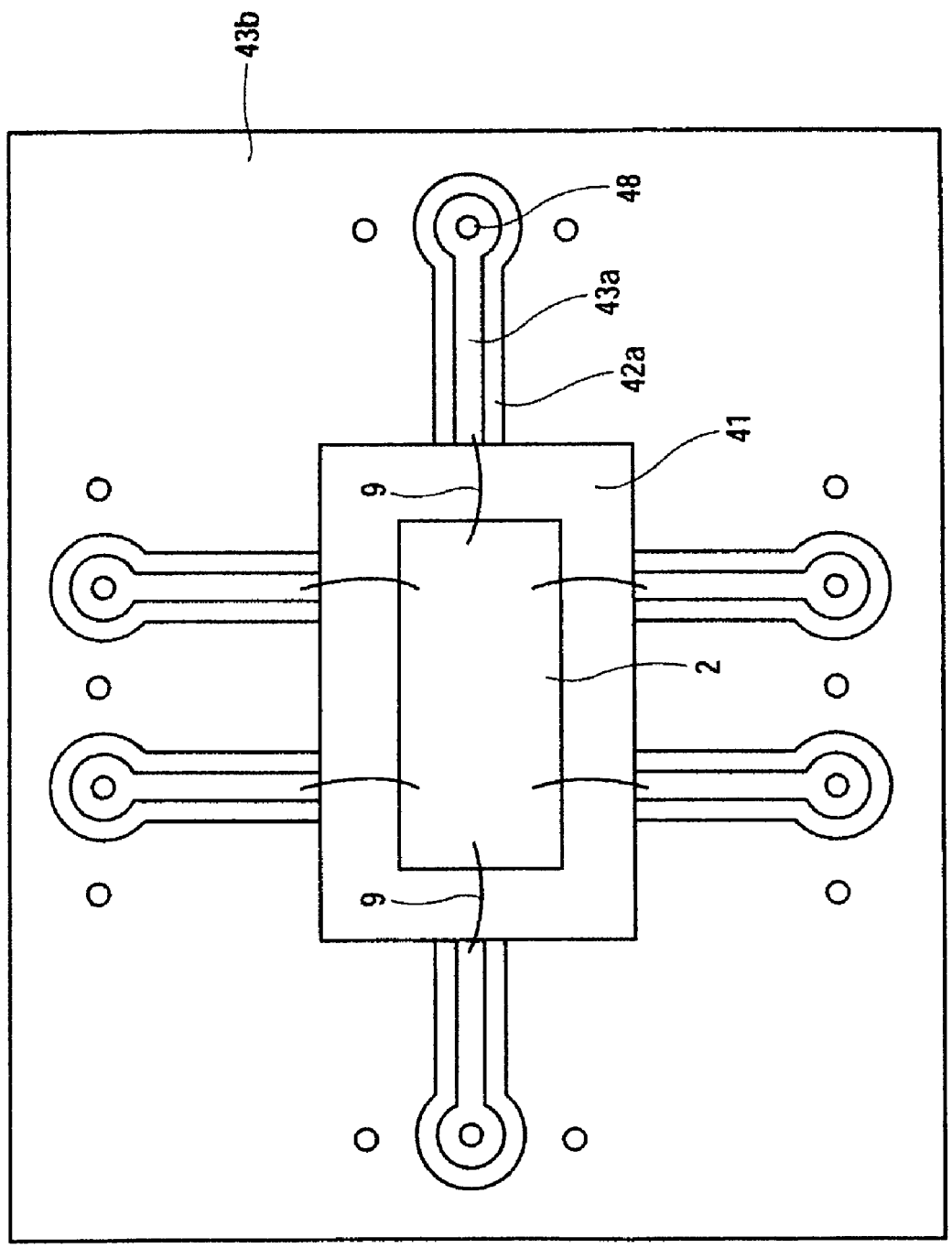
Figure 6:
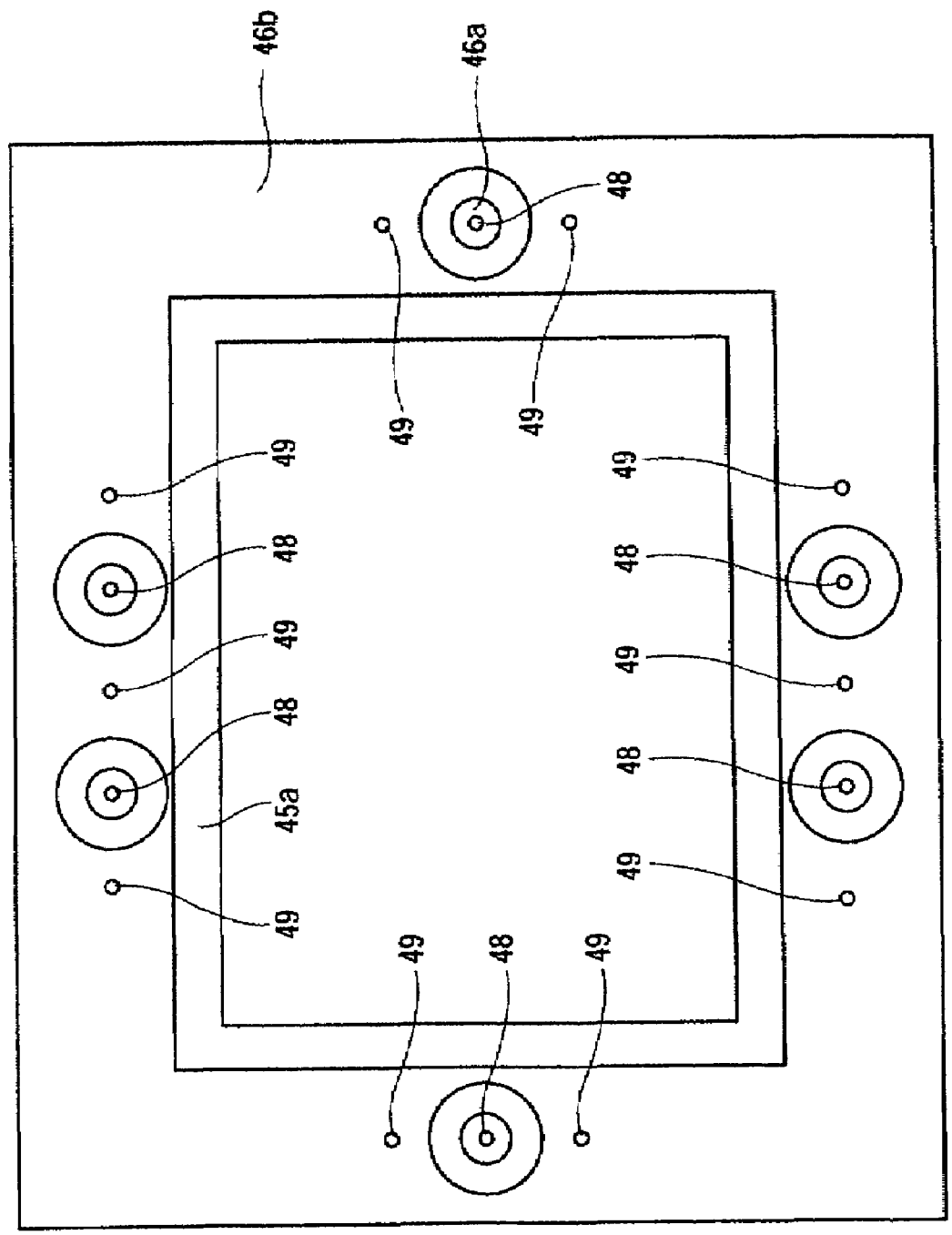
Figure 7:
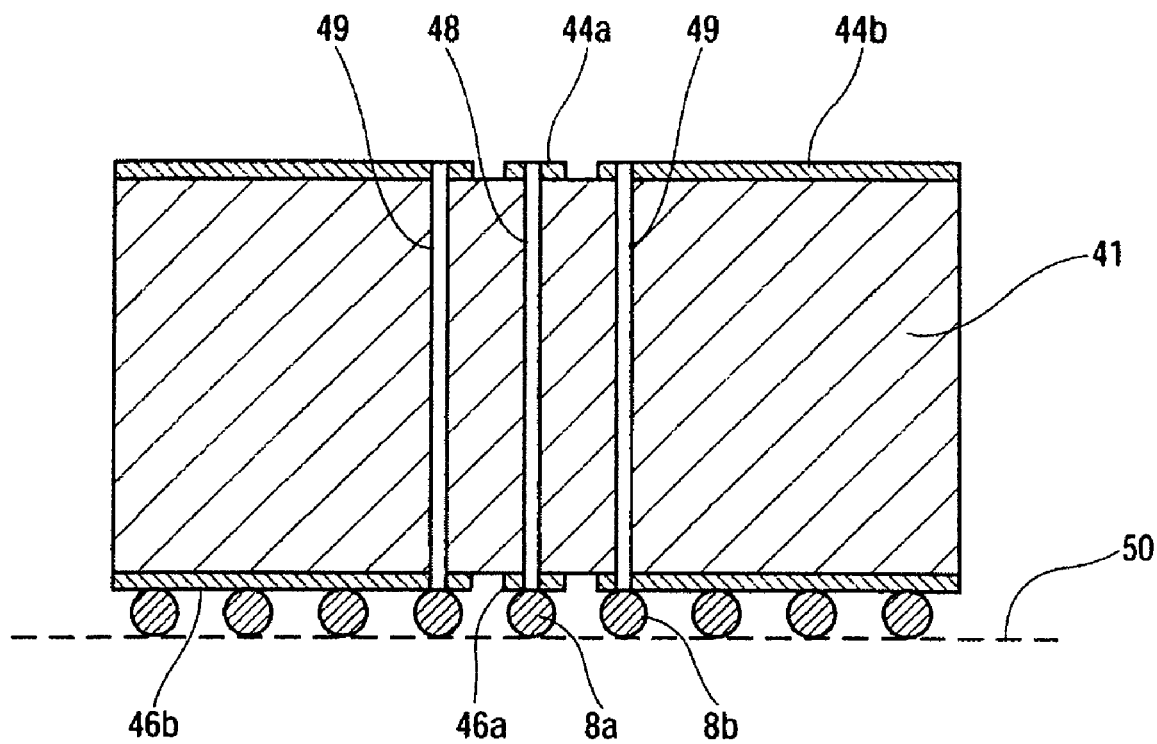

Reference is now made to FIG. 5. The microwave and low frequency inputs-outputs of the chip 2 are linked to tracks 43a formed in the conducting layer 43. The link may be effected with conducting wires 9. Preferably, the thickness of the frame 41 is designed so that these wire links are as short as possible, this being the case when the active surface of the chip is in the plane of the conducting layer 43. The conducting layer 43 can comprise a surface 43b almost entirely covering the insulating thickness 42a. Recesses are made on the interior of the surface 43b so as to electrically insulate tracks 43a.

Metallized holes 48 are linked to the interior of the insulating thickness 45a. The metallized holes 48, preferably plugged to ensure leaktightness, electrically link the tracks 43a of the layer 43 with disks 46a of the layer 46. As illustrated in the vertical section represented in FIG. 7, a metallized hole 48 links a conducting disk 44a at the top of the lower frame with a conducting disk 46a at the bottom of the lower frame. The conducting disk 44a on top is in contact with a track 43a. Recesses made in the conducting surface 46b make it possible to electrically insulate disks 46a.

According to a first embodiment, the disks 46a form connection points of the package 40, in the same manner as the disks 30 formed the connection points of the package 1.

According to an advantageous embodiment (see FIG. 4), conducting balls 8a are placed in contact with the disks 46a, these balls constituting an integral part of the package. They then form the connection points of the package 40, in the same manner as for the package 1.

According to an advantageous embodiment, the metallized holes are shielded in the thickness of the insulating layer 45a. For this purpose, other metallized holes 49 may be made on the interior of the insulating layer 45a, in the same manner as the metallized holes 48. The metallized holes 49 make it possible to electrically link the surfaces 43b and 46b forming earths. Moreover, the interior periphery 45c of the lower frame may be rendered conducting, except in the places where it comes into contact with the tracks 43a.

Other conducting balls 8b, constituting an integral part of the package 40, may be placed so as to electrically link the conducting surface 46b and also the plate 47 with the earth of the exterior circuit (not represented).

The exterior circuit may be a multilayer circuit of the type of that described in conjunction with FIG. 1. The package 40 is mounted on the exterior circuit in the same manner as the package 1.

In the absence of conducting balls, the exterior surface of the base 46, 47 forms the mounting surface of the package. In the presence of conducting balls 8a, 8b, the latter form the mounting surface 50 of the package.

Epoxy resin substrates are not suitable for microwave applications. Advantageously, the insulating parts of the package are made with a microwave substrate, that is to say a substrate having a controlled dielectric constant and a low loss tangent (losses of microwave power across the substrate). The microwave substrate may for example be a hydrocarbon filled with glass fibers or with silica powder, or based on filled Teflon.

Of course, the invention is not limited to these embodiments given by way of example. The package according to the invention is not necessarily formed with walls. The walls and the cover could be replaced with a single item forming a glued metal cap. The package according to the invention is not necessarily a parallelepipedal pack. Its function is to produce an interconnection, to protect a component against mechanical, chemical attack and to preclude any electromagnetic coupling. The package may for example be formed by a resin surrounding the component.

The invention claimed is:

1. A microwave package, the walls of which delimiting an internal cavity to accommodate a microwave device, said package comprising:
   a upper wall,
   a lower wall constituting a base of said package, intended to be mounted on an exterior circuit board comprising connection points to connect electrically said microwave device with said exterior circuit board, some of the connection points being connected with some inputs/outputs of said microwave device and some other connection points being connected a package earth;
   side walls between the upper wall and the lower wall;
   wherein, the external faces of the walls being conductive, said package forms a Faraday cage around the cavity; the inputs/outputs of the microwave device being linked to the corresponding connection points of the base by means of metallized holes passing through the package base; each metallized hole being linked by one end, via a conductive link situated in the cavity, to an input or an output of the microwave device, and by the other end, passing through the base of the package, to the corresponding connection point situated on the external face of the package base; a metallized hole conveying a signal being surrounded by other metallized holes linked to the package earth so as to form a coaxial connection.

2. The package according to claim 1, wherein a connection point is linked to an input-output by the metallized hole forming a straight connection, said connection being perpendicular to the exterior circuit board on which the package is mounted.

3. The package according to claim 1, wherein the base being formed by an insulating material partially covered with a conductive layer, the metallized holes conveying microwave signals pass through the insulating material.

4. The package according to claim 1, wherein each connection point situated on the external face of the package base comprises a conducting earth or signal ball.

5. The package according to claim 4, further comprising a coaxial structure formed by some conducting balls linked to the Faraday cage and forming earth connection points placed around each conducting ball forming a signal connection point, said coaxial structure making a shielding of said signal connection.

6. The package according to claim 5, wherein earth conducting balls placed around a signal conducting ball are at least three in number.

7. The package according to claim 6, wherein earth conducting balls are distributed around a signal conducting ball over 360°.

8. A mounting comprising a package as claimed in claim 1 and a multilayer circuit comprising a first conducting earth plane on its surface and connection points with metallized holes passing through the circuit to link said connection points to some tracks inside the circuit so as to convey signals across the earth plane to said tracks, said connection points being arranged so as to be opposite the signal connection points of the package when the package is mounted on the multilayer circuit.

9. The mounting according to claim 8, wherein the multilayer circuit comprises a second conducting earth plane on the side opposite the side of the first earth plane, the two earth planes being on either side of the tracks.

10. The mounting according to claim 9, wherein the conducting earth planes of the multilayer circuit are linked together by metallized holes.

11. The mounting according to claim 9, wherein the earth conducting balls of the package are linked to at least one conducting earth plane of the multilayer circuit.

12. The package according to claim 1, wherein the microwave device is placed in the internal cavity on the internal face of the lower wall.

13. A microwave component package, comprising:
   a lower wall defining a base of said package, configured to be mounted on an exterior circuit board, the base having an interior layer with connection points and an exterior layer with connection points;
   side metal walls disposed on the lower wall to form an interior volume;
   a top metal plate disposed on the side walls, thereby forming a Faraday cage around the interior volume; and
   a microwave component disposed inside the Faraday cage, said microwave component having inputs/outputs electrically connected to the connection points of the interior layer;
   wherein said base has a plurality of signal metallized holes passing therethrough for conveying a microwave signal between the microwave component and the exterior circuit board, and a plurality of earth metallized holes passing therethrough for surrounding each of the signal metallized holes so as to form a coaxial structure.

14. The package as claimed in claim 13, wherein said metallized holes form straight connections between to the connection points of the interior layer and exterior layer and said connections are perpendicular to the exterior circuit board on which the package is mounted.

15. The package as claimed in claim 13, wherein the base is formed by an insulating material formed and is partially covered with a conductive layer, and the metallized holes conveying microwave signals pass through the insulating material.

16. The package according to claim 13, wherein each connection point on the external layer of the base comprises a conducting earth or signal ball.

17. The package as claimed in claim 13, wherein the coaxial structure has signal ball and a plurality of conducting earth balls connected electrically to the Faraday cage and placed around the signal ball.

18. The package as claimed in claim 13, wherein the earth metallized holes surrounded around the signal metallized hole are at least three in number.

19. The package as claimed in claim 13, wherein the earth metallized holes surrounded around the signal metallized hole are distributed around the signal ball over 360°.

\* \* \* \* \*